(12) United States Patent
Mansell

(10) Patent No.: US 8,031,033 B2
(45) Date of Patent: Oct. 4, 2011

(54) PRINTED MULTILAYER SOLENOID DELAY LINE HAVING AT LEAST TWO SUB-SETS WITH DIFFERENT PATTERNS

(75) Inventor: Barry Mansell, Groton, MA (US); Gail E. Mansell, legal representative, Groton, MA (US)

(73) Assignee: Avocent Corporation, Huntsville, AL (US)

( * ) Notice: Subject to any disclaimer, the term of this patent is extended or adjusted under 35 U.S.C. 154(b) by 657 days.

(21) Appl. No.: 11/605,253

(22) Filed: Nov. 29, 2006

(65) Prior Publication Data

US 2007/0123387 A1    May 31, 2007

Related U.S. Application Data

(60) Provisional application No. 60/740,637, filed on Nov. 30, 2005.

(51) Int. Cl.
*H01P 1/18* (2006.01)
(52) U.S. Cl. .......................................... 333/140; 333/162
(58) Field of Classification Search .................. 333/162, 333/156, 161, 140
See application file for complete search history.

(56) References Cited

U.S. PATENT DOCUMENTS

| | | | |
|---|---|---|---|
| 2,982,889 A | 5/1961 | Whearley | |
| 3,005,966 A * | 10/1961 | Strom | 333/162 |
| 4,583,062 A * | 4/1986 | Kameya | 333/138 |
| 4,613,874 A | 9/1986 | Trimble | |
| 4,729,510 A * | 3/1988 | Landis | 333/162 |
| 4,807,184 A | 2/1989 | Shelor | |
| 5,461,353 A | 10/1995 | Eberhardt | |
| 5,923,230 A * | 7/1999 | Yoshida et al. | 333/161 |
| 6,229,124 B1 | 5/2001 | Trucco | |
| 6,313,716 B1 * | 11/2001 | Apostolos | 333/162 |
| 6,493,861 B1 | 12/2002 | Li et al. | |
| 2001/0040051 A1 | 11/2001 | Lipponen | |
| 2002/0070831 A1 | 6/2002 | Harding | |
| 2004/0263308 A1 | 12/2004 | Yu et al. | |
| 2005/0071733 A1 | 3/2005 | Fukae et al. | |

FOREIGN PATENT DOCUMENTS

| | | |
|---|---|---|
| EP | 0880309 | 11/1998 |
| EP | 1286464 | 2/2003 |
| EP | 1443529 | 8/2004 |
| JP | 2005268447 | 9/2005 |
| WO | WO 02/088975 | 11/2002 |

OTHER PUBLICATIONS

International Search Report and Written Opinion mailed Sep. 26, 2007 in International Application No. PCT/US2007/045775.
European Extended Search Report and Written Opinion in EP Appln. No. 06844653.3-Jun. 19, 2009.
EP Appln. No. 06844653.3-Aug. 12, 2009 EPO Office Action.
Measurements and Modelling of Delay Lines on Printed Circuit Boards, by Scott D. Powers and jose M. Cruz, The SML Technical Report Series pub. by Sun Microsystems Laboratories, 2000.

(Continued)

*Primary Examiner* — Benny Lee
(74) *Attorney, Agent, or Firm* — Davidson Berquist Jackson & Gowdey, LLP

(57) ABSTRACT

A printed solenoid inductor delay line system comprises discrete delay sections, where the inductor is implemented in the form of a printed, spiraling solenoid, with the solenoid axis in the plane of the multi-layer printed circuit board (PCB).

13 Claims, 9 Drawing Sheets

OTHER PUBLICATIONS

The Impact of Material Selection, by Rick Hartley, Printed Circuit Design, Mar. 2002.
Optimization of Readout Electronics for Microchanel Plate Delay Line Anodes, by John Vallerga and Jason McPhate, Space Science Laboratory, Univ. of Calfornis, Berkley, Mar. 2002.
Analog Delay Devices, J.B. Calvert, Jan. 2002.
EP Appln. No. 06844653.3—Mar. 3, 2010 EPO Office Action.
EP Appln. No. 06844653.3—Nov. 8, 2010 EPO Office Action.
Preliminary Report on Patentability issued on Jun. 3, 2008 in PCT Appln. No. PCT/US2006/045775.
EP Appln. No. 06718869.8—Mar. 1, 2011 EPO Office Action.

* cited by examiner

PRINTED MULTILAYER SOLENOID DELAY LINE HAVING AT LEAST TWO SUB-SETS WITH DIFFERENT PATTERNS

CROSS REFERENCE TO RELATED APPLICATION

The present application claims the benefit under 35 USC 119(e) of U.S. Application Ser. No. 60/740,637 filed Nov. 30, 2005, the entire contents of which are herein incorporated by reference.

FIELD OF THE INVENTION

The present invention relates to solenoid delay lines. More specifically, the invention relates to a printed multilayer solenoid delay line system.

BACKGROUND & SUMMARY OF THE INVENTION

Signal skew is a well-known characteristic in high speed communications and video signal transmission. Signal skew also occurs in multiple twisted-pair cables that are prevalent today in computer networking. Generally speaking, skew is the mismatch in arrival times of data on different signal lines where the data was originally transmitted at the same time. Skew is caused by different propagation rates through different pairs of cable. This, in turn, in the case of twisted-pair cables, is typically caused by different twist rates for the pairs of signal lines. Paired signal wires that have a tighter twist rate cause the signals to propagate over a greater distance. Cables containing twisted pair wires are intentionally designed so that different pairs have different twist rates in order to reduce the cross talk between signal wire pairs.

Details of specifying delay lines are described in "Specifying Delay Lines," by Lester Jacobson, Allen Avionics, Electronic Products Magazine, the contents of which are incorporated herein by reference.

U.S. Pat. No. 6,377,629, titled "Twisted Pair Communications Line System," to Stewart et al., issued Apr. 23, 2002, the entire contents of which are incorporated herein by reference, illustrates a delay line formed by serpentine arrangements formed on two sides of a printed circuit board, e.g., FIG. 3 and column 9, line 24 to column 10, line 50 therein.

DETAILED DESCRIPTION OF THE INVENTION

Figure 1A:
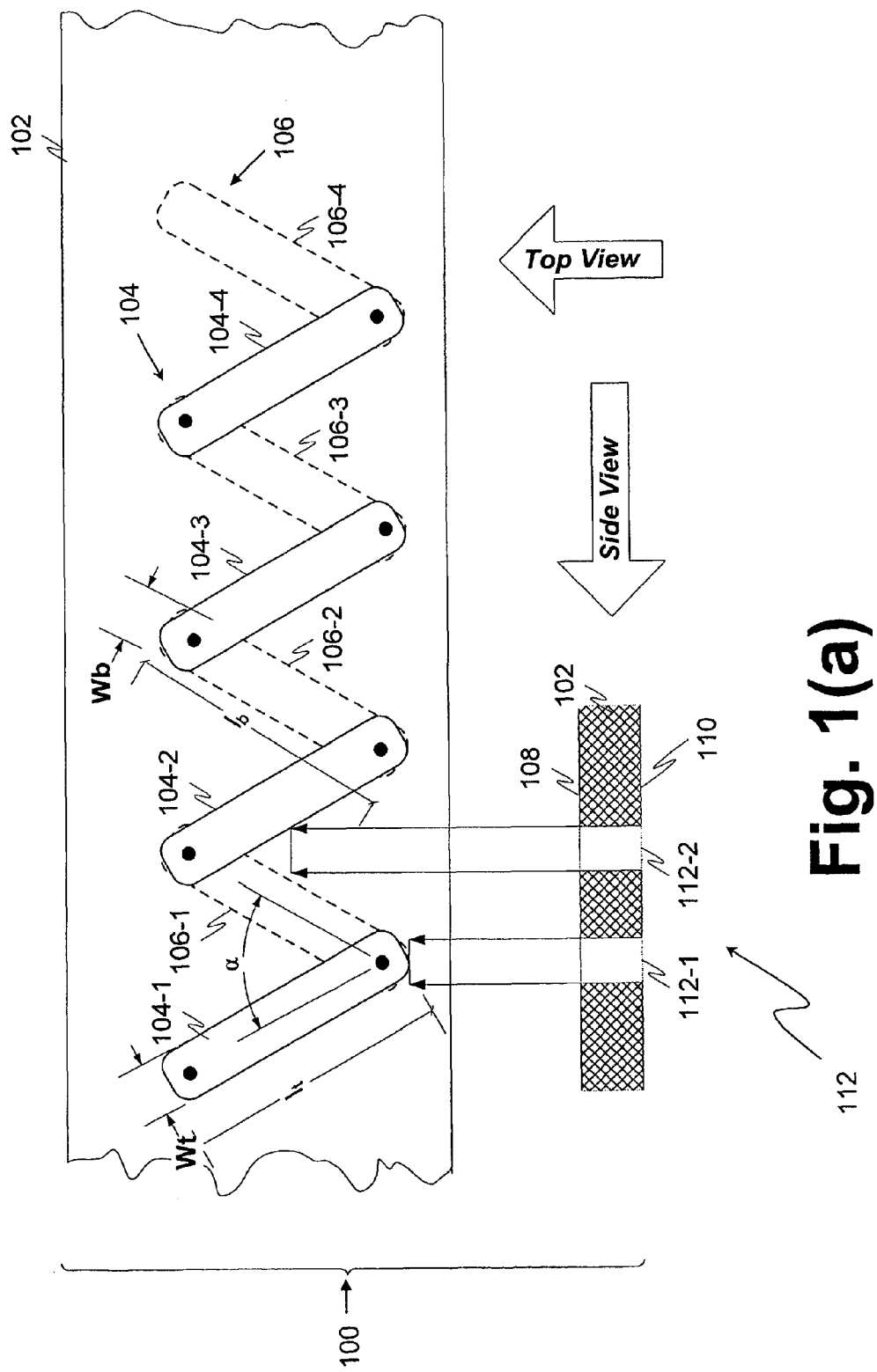
FIG. 1(a) shows a top view and a side view of a printed solenoid for use in a delay line, according to embodiments of the present invention.

FIG. 1(a) illustrates the a solenoid delay inductor 100, formed on two layers of a multilayer printed circuit board (PCB) 102. The solenoid delay inductor 100 comprises a number of top portions 104-1, 104-2, 104-3 and 104-4, (generally, top portions 104) formed on a portion of a first layer 108 of the PCB 102 and a number of bottom portions 106-1, 106-2, 106-3 and 106-4, (generally bottom portions 106) formed on a portion of a different layer 110 of the PCB 102. In the case of a two layer PCB, the different layer 110 will be the bottom layer of the PCB 102.

The top portions are connected through electrical connection vias 112-1, 112-2, . . . , (generally vias 112) formed in the PCB 102. Thus, as shown in FIG. 1(a), top portion 104-1 connects electrically to bottom portion 106-1 through the via 112-1. In this manner, the top and bottom portions and their electrical connections form a solenoid delay, with the electrical connections effecting the solenoid windings.

The length $l_t$ and width $w_t$ of each top portion 104 may be substantially the same for each top portion, or they may differ. Similarly, the length $l_b$ and width $w_b$ of each bottom portion 106 may be substantially the same for each top portion, or they may differ.

Each top portion, for example, 104-1, forms an angle α with each bottom portion, for example 106-1, to which it connects. The angles α may be the same (or substantially the same) for each top and corresponding bottom portion or they may differ.

The connected top and bottom portions form a delay solenoid with the solenoid axis in the plane of the PCB. Each top element or portion forms a portion of a delay line, as does each bottom portion or element. In the example shown, there are four top portions and four bottom portions. Those of skill in the art will immediately realize that the number and sizes of the portions depends on the amount of delay required in the line. Further, in the example shown, only two layers are shown. Those skilled in the art will realize that more than two layers can be used and are contemplated herein.

The drawings are not to scale, and the angles between corresponding elements may be adjusted in order to reduce space requirements. In addition, those skilled in the art will realize that the solenoids according to embodiments of the present invention need not be symmetric. There is no requirement, e.g., that each of the top elements 104 be the same size as the others, and similarly, there is no requirement for the lower elements 106.

Figure 1B:
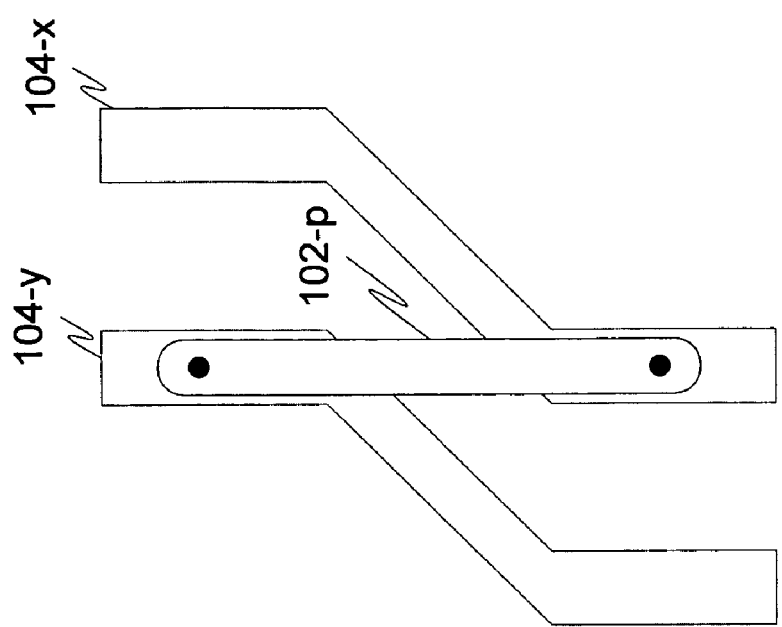
FIGS. 1(b), 2-7, 8(a), 8(b), and 8(c) show alternate embodiments of the present invention.

FIG. 1(b) shows an alternate manner of forming the lower portions 104-x, 104-y, so that the top portions 102p need not be formed at angles.

Figure 2:
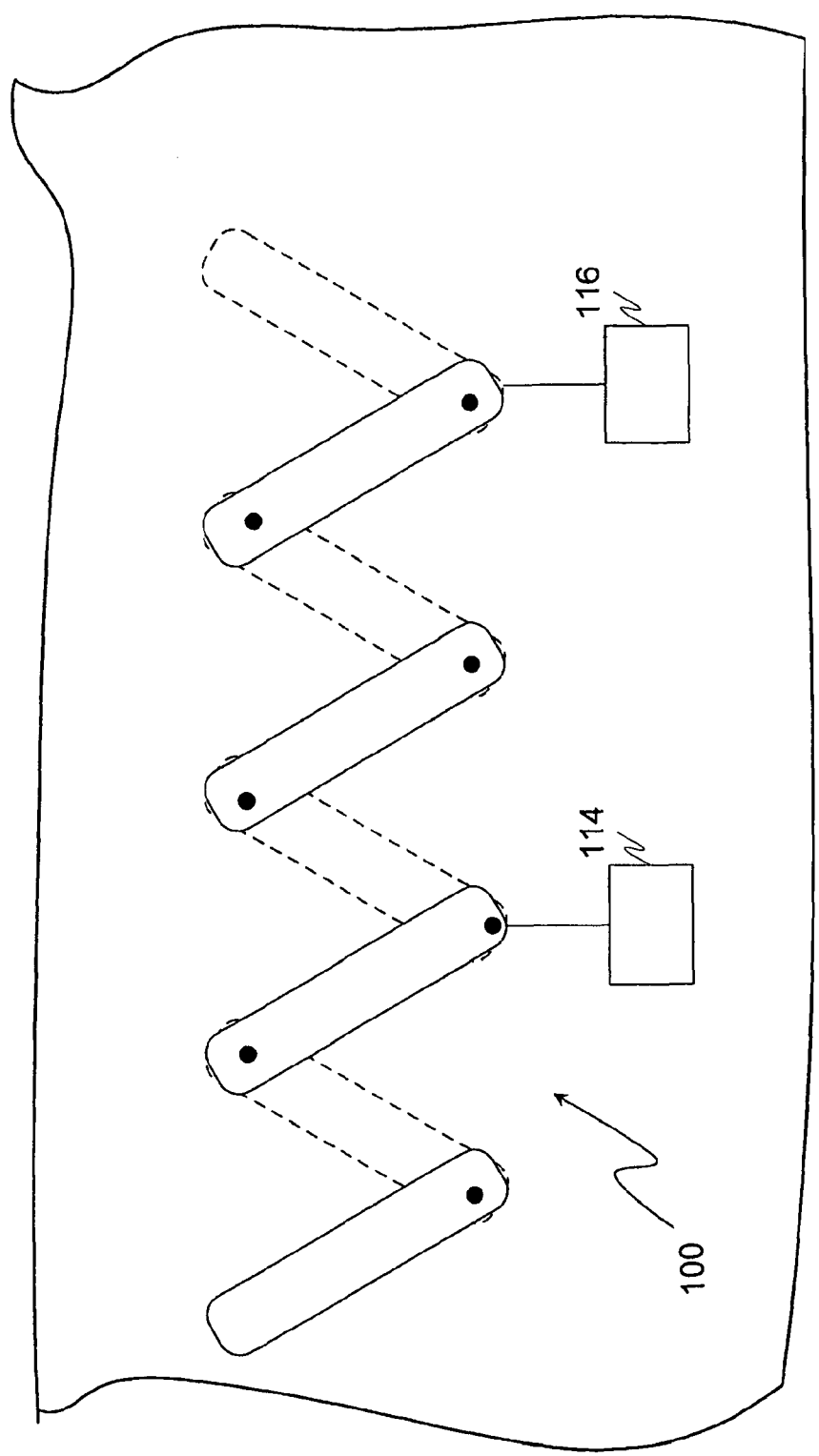

As shown in FIG. 2, discrete capacitors 114, 116 may be placed underneath the solenoid 100 in order to match the capacitance of some other component of a circuit (e.g., a switch, not shown). Embodiments of the present invention may use printed capacitors with a ground plane, or omit capacitors altogether, by using the inherent capacitance of switching elements.

In preferred implementations, etch width is kept fairly large to reduce losses. However, this limits the number of turns and inductance. Other sub-inductor segmentation can be implemented, rather than the long coupled solenoid design as shown, such as through non-coupled or anti-coupled designs shown in FIGS. 3 and 4, respectively.

Figure 3:
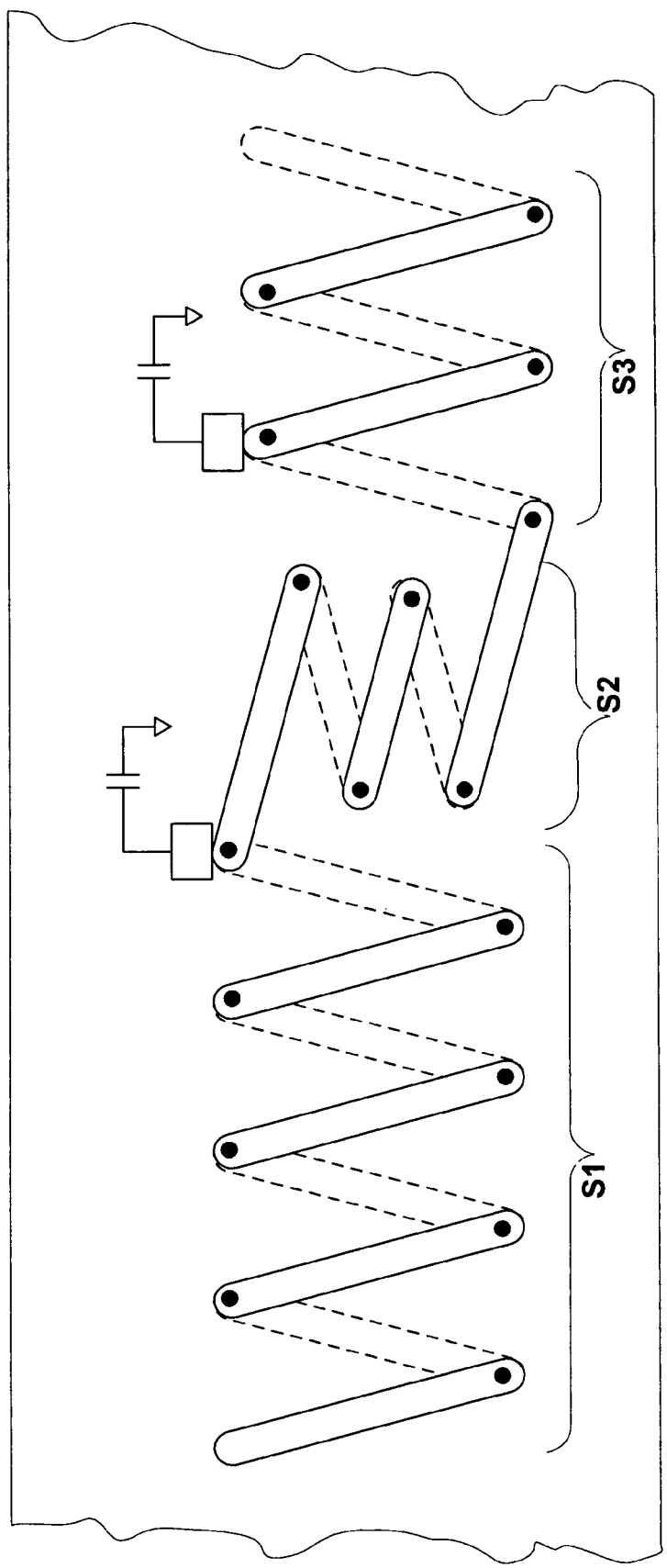
Figure 4:
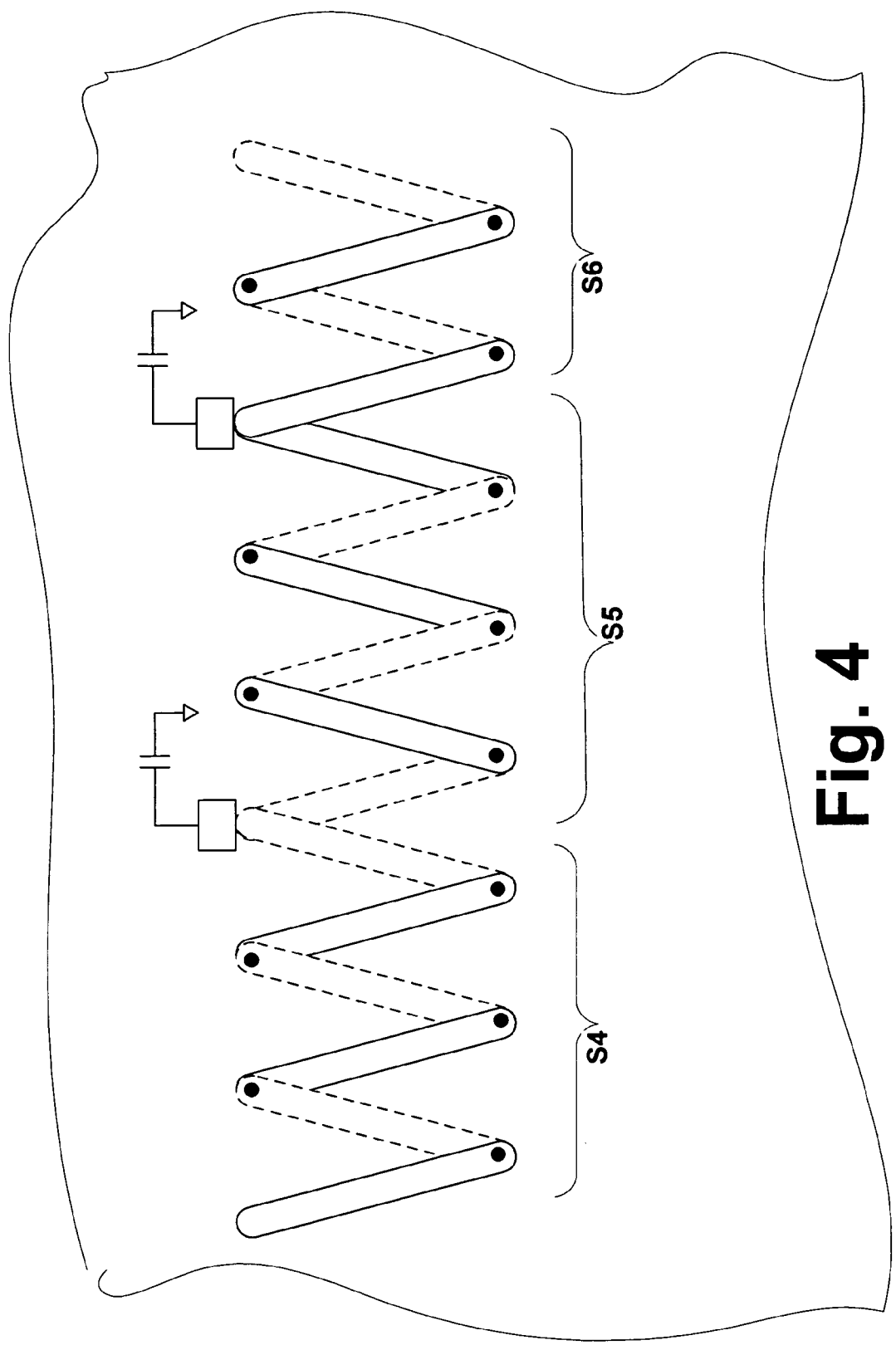

In the embodiments of the present invention shown in FIG. 3, the solenoid delay circuitry comprises three parts, denoted S1, S2 and S3 and FIG. 4 shows three parts S4, S5 and S6.

Some embodiments of the present invention may use more-distributed capacitance, by utilizing at least one layer of the inductor closely spaced to a ground plane.

Figure 5:
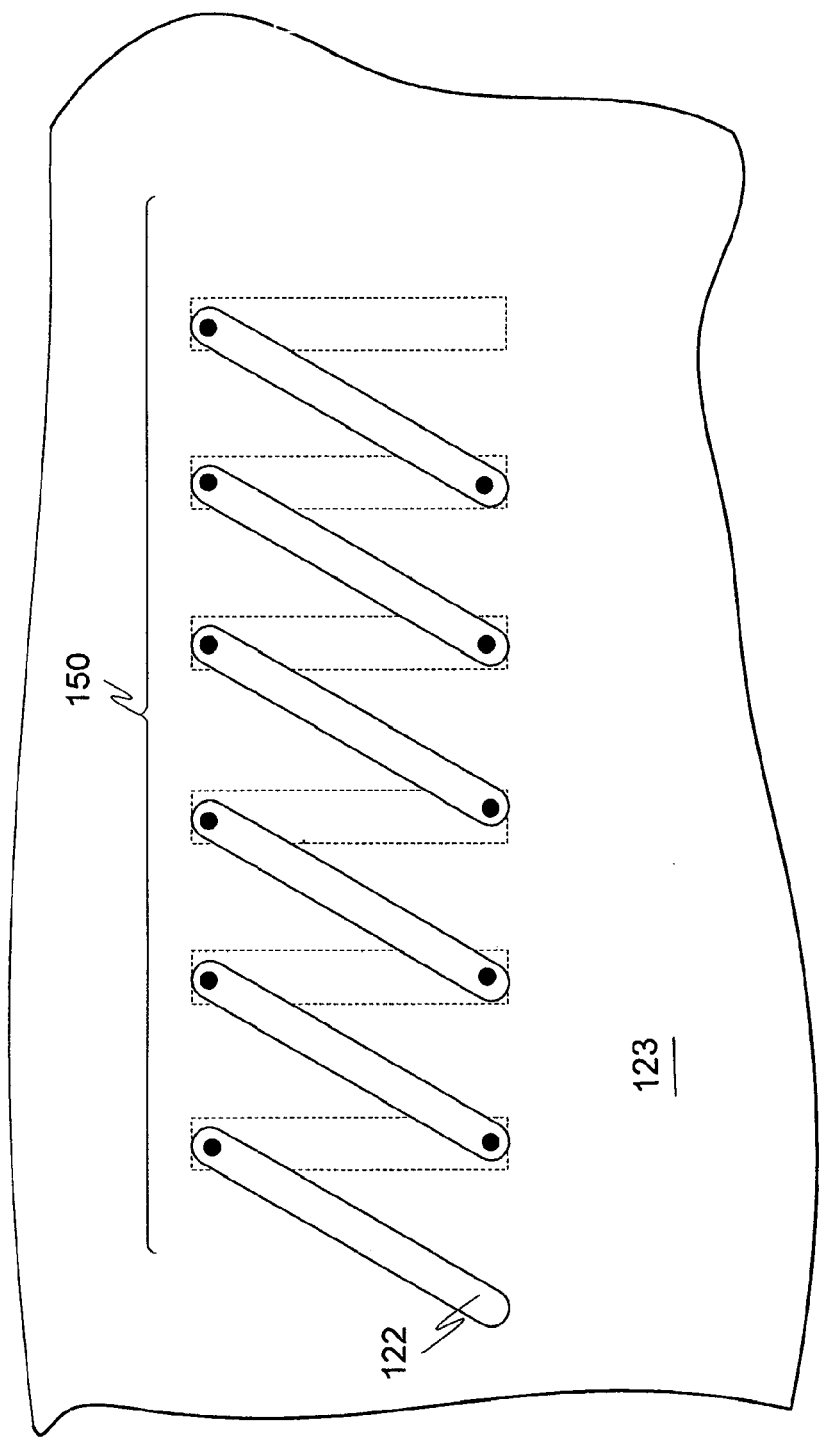

FIG. 5 is a top view of a solenoid delay 150 according to embodiments of the present invention, with the inductor 122 on inner layers or the top ground plane 123, and the bottom layer ground plane being uniform. A row of vias connects the top and bottom ground planes. Cuts can be inserted, overlaying the inductor turn separations, to reduce any possible circulating currents.

Figure 6:
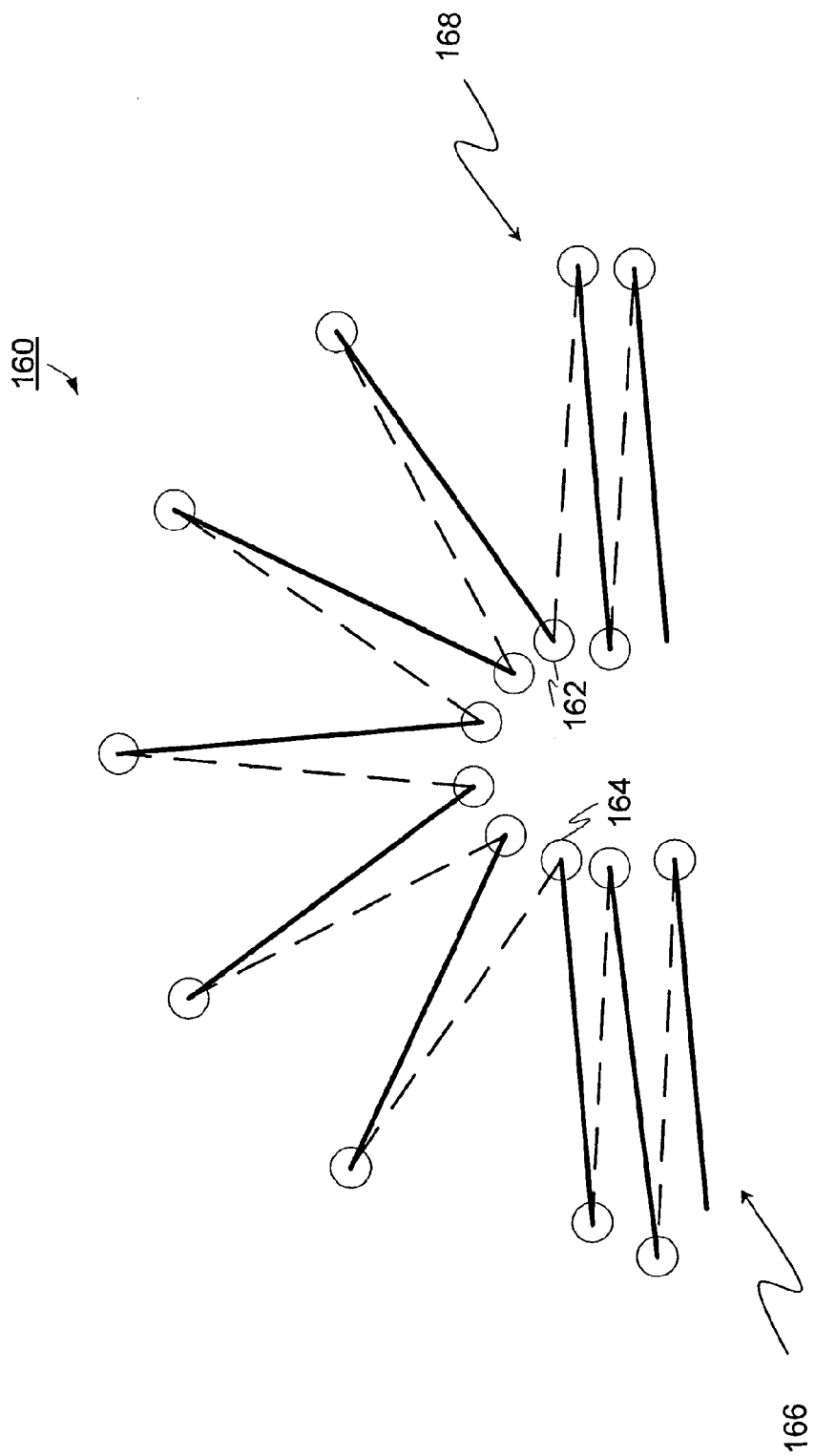

FIG. 6 depicts another layout of a solenoid delay according to embodiments of the present invention. As shown in the drawing, a solenoid delay 160 has a star shape (the solid lines are on a first layer of the PCB, and the dashed lines are on a second layer). The elements on the first layer connect to corresponding elements on the second layer through electrical vias (denoted as circles). The configuration shown in FIG. 6 allows a delay line segment to complete a 180-degree turn. That is, a the segment 160 can connect to other solenoid delay segments (166, 168) at locations 162 and 164.

For some embodiments of the present invention, at least a 32 ns delay is needed to complete a turn. The radial or star embodiment of FIG. 6 can make a smooth turn with 30-degree angle turns. Although this design can claim much of the end area of the PCB, as compared to implementing other types of physical delay or circuitry in this area, it is a safe way to avoid unwanted interference. This end space contains five turns, but those of skill in the art will realize the fewer or more turns could be used.

Figure 7:
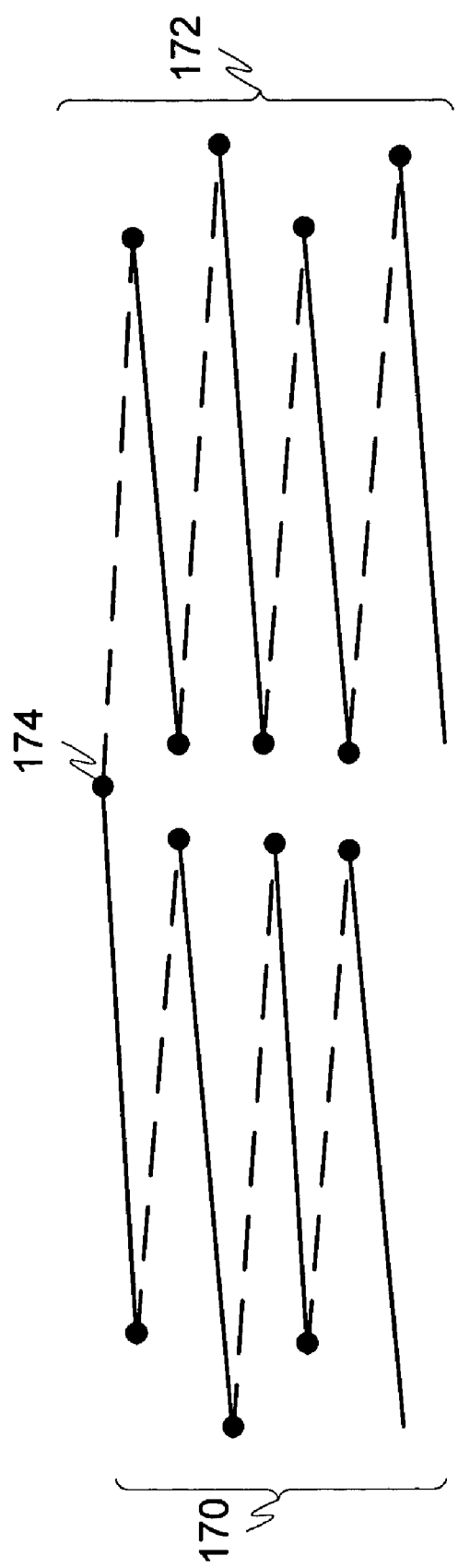

FIG. 7 shows an alternate configuration designed to complete a 180-degree turn, using an arrangement of two solenoids 170, 172 in series and connected centrally at the central joining ground pad 174.

The section directly above the central joining pad 174 may be left empty of other circuitry, in order to reduce chances of interference with solenoid end-fields. Main separation between rows can be increased, to reduce capacitive coupling across sections. The two inner row sections can be staggered for lower capacitance.

Figure 8A:
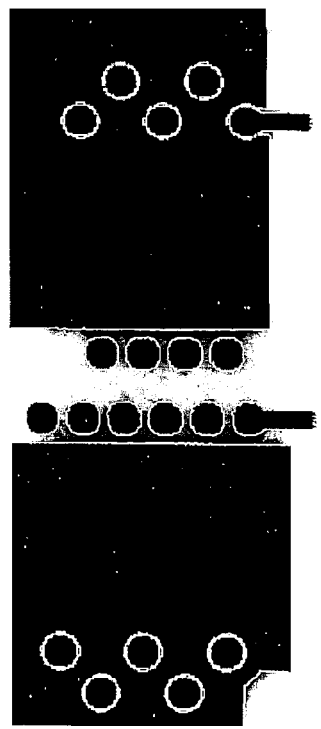
Figure 8B:
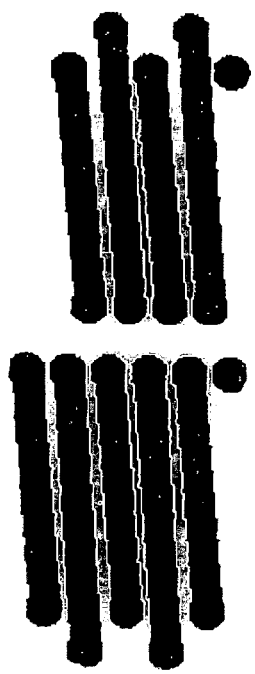
Figure 8C:
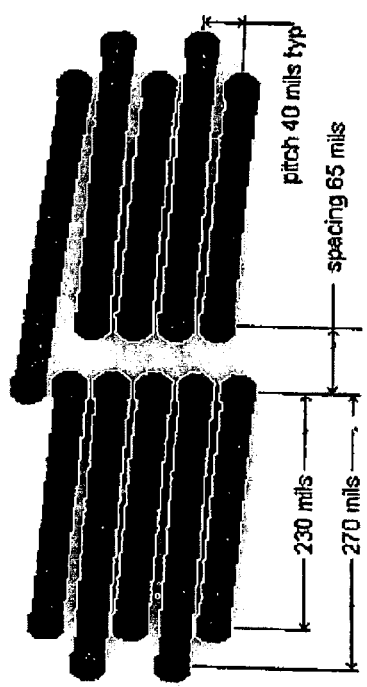

FIG. 8*a* shows the top and bottom layers of the multi-layer PCB in a solenoid delay line and together with FIGS. 8*b* and 8*c* show a portion of a delay line solenoid which is long enough to be folded 180 degrees. Signal entry is shown as entering the top layer and the number of turns will depend on the delay needed. FIG. 8*b* shows another layer and FIG. 8*c* shows a layer below or above FIG. 8*b* and the specific dimensional values provided therein which are diagonal lengths ranging from 230 to 270 mils, a pitch of 40 mils and with the spacing between the adjacent subsets being 65 mils as shown in FIG. 8*c*. As shown, the longer of the diagonals may come too close to pads. If so, then a bump can be put in those at such points, such that the portion outside the inner row of holes is horizontal rather thin slanted. Typical lengths for the diagonals are shown in FIG. 8*c* as is the spacing between the two sets of diagonals and pitch spacing there between.

In order to reduce the chance of possible coupling to the solenoid's field, an empty area should be left at each end, free of components or crossing etch; the dimensions implemented in preferred embodiments are 200 mils deep at one end, and 100 mils deep on the other end, each empty area having a width of about 100 mils. In a preferred embodiments of the present invention, the pitch between turns should be 40 mils, and spacing between left and right sections of the coil should be 65 mils. In some preferred embodiments, wider coil turns have a width of 270 mils, and the shorter turns have a width of 230 mils.

The following provides further detailed descriptions of the particular manufacturing and materials for construction of the present invention.

In some embodiments of the present invention, the PCB structure has a 59 mil rigid core center, with 1 oz. of copper mated to both sides. Thus, the center portion of the board could consist of approximately 56 mils of a common glass epoxy, such as FR4. Each side of the board has 7 mils of 7628 prepreg and a ½ oz of copper, which can optionally be plated up to 1 oz. In some cases, 4.5 mil of 2116 prepeg may be used if more capacitance is required. However, the overall board thickness is approximately 75 mils.

The solenoid structure has a plated-through-hole (PTH) diameter of 15 mils. Additionally, the winding pitch equals about 40 mils. This is accomplished by having an outer layer of 31 mils, utilizing an 8 mil annular ring and 9 mil spacing between the pads. Further, the inner layer will be 35 mils., having a 10 mil annular ring and 5 mil spacing between the pads. Optionally, for pads staggered on a 40 mil grid, the pitch will be 56.6 mils. Consequently there will be 25.6 mils between pads on the top layer, which allows for a 9 mil run pass-through or area-fill copper, and 8 mil spaces. In order to get capacitance to ground, a 13 mil pass-through and 6 mil spaces may be utilized.

The inductors are wound on the inner layer of the solenoid, giving a 56 mil thickness of the solenoid. Additionally, the solenoid turns use 30 mil copper, allowing for 10 mil spaces (which are slightly decreased due to the angle of the turn). Further, the solenoid has one side with pads in a straight line and the other side has pads that are staggered, allowing for good top-layer ground pass-through on the staggered side.

The nominal solenoid width, consisting of the average of any staggered holes, is 250 mils. Thus, the solenoid cross-sectional area is 0.014 square inches (0.356 mm$^2$). Consequently, the resulting inductance is:

$$L=4.46 \times N^2/(0.4 \times N+0.6)nH$$

where N is the number of turns. Consequently, for longer solenoids, the inductance is 11 nH/turn, whereas shorter solenoids have an inductance of 10 nH/turn. Thus, in one embodiment where end-inductances are added to a solenoid for impedance matching, an inductance of 10 nH/turn should be used.

The capacitance, impedance and delay details for one embodiment are as follows. A dielectric constant ($E_r$) of 4.7 is used for the 7628 prepreg that forms the capacitor dielectric. The capacitance of a straight, 30 mil wide run on the inner layer to an outer layer on the ground plane is then determined to be 7.44 pF/in. Thus, with the solenoid geometry as previously described, the 8 mil top layer spaces between pads and the ground plane, thus making the effective capacitor length per turn 0.0430 in. Therefore, the capacitance is about 3.2 pF/turn. The impedance is calculated to be 59Ω (ohms) for long solenoids, and 56Ω for short solenoids.

The time delay for the above value is 0.188 nS/turn. For shorter solenoids, this would be 0.179 nS/turn, which is approximately twice the delay of an equivalent length of stripline. Additionally, the delay rate is 4.7 nS/in. along the solenoid's length, and 4.5 nS/in. if short. Additionally, the individual half-turn delay sections are short enough to support high bandwidth signals.

Further, in this embodiment, the solenoid "track width" should be 0.325 in. Thus, the delay density is 14.4.nS/in$^2$. Additionally, the DC resistance results primarily from the 30 mil of copper. The 30 mil of copper equals 1 oz of copper, and gives the entire solenoid approximately 17 mΩ/in, which correlates to 8.8 mΩ/turn and 46.8 mΩ/nS. The DC resistance reduces the signal strength, so the image colors may be affected. The pads have the main copper path width being 20 mils. The coil width is 106 mils. between centers, which allows enough space for two vias both inside and outside the "near" coil side. The coil length can be variable in order to get the proper inductance, however a square coil may be preferable in some cases.

In order to avoid a shorted turn, ground vias should not be used anywhere within a the solenoid area.

Those skilled in the art will realize that the number of turns and the length of the elements will depend on the delay needed.

It is preferable to have two turns (at signal entry and exit points) which do not have the outer ground layer covering. These turns may be used for matching where an unloaded inductance is desired.

Applications

Solenoid delay lines according to embodiments of the present invention are applicable in a multitude of applications. However, they are particularly suited to Keyboard, Video, Mouse (KVM) applications in which video data are transmitted via twisted pairs. The invention may be incorporated into systems such as described in U.S. patent application Ser. No. 10/366,695, titled "Automatic Equalization of Video Signals," filed Feb. 14, 2003, now U.S. Pat. No. 7,221,389 which issued on May 22, 2007, and U.S. Pat. No. 6,377,629, titled "Twisted Pair Communications Line System," issued Apr. 23, 2002, the entire contents of each of which are incorporated herein by reference.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed:

1. A solenoid delay line disposed on at least two layers of a multilayer printed circuit board (PCB), comprising:
   a first plurality of first discrete delay elements formed on a first layer of said PCB; and
   a second plurality of second discrete delay elements formed on a second layer of said PCB, distinct from said first layer,
   each of said first discrete delay elements being electrically connected to at least one of said discrete second delay elements and corresponding ones of said first and second delay elements are connected to each other through vias formed in said PCB;
   wherein the delay line includes at least two parts having parallel solenoid axes and electrically connected together by an intermediate part selected from the group consisting of:
   an intermediate part formed by alternating first and second elements and extending transversally with respect to the axes of the at least two parts;
   an intermediate part having a star-like configuration and defining a 180-degree turn,
   an intermediate ground pad, the at least two parts forming a 180-degree turn at the intermediate ground pad.

2. A solenoid delay line formed on at least two layers of a multilayer printed circuit board (PCB), comprising:
   a first plurality of discrete delay elements disposed on a first layer of said PCB; and
   a second plurality of discrete delay elements disposed on a second layer of said PCB, distinct from said first layer,
   each of said first discrete delay elements being electrically connected to at least one of said discrete second delay elements and corresponding ones of said first and second delay elements are connected to each other through vias disposed in said PCB; and
   the first and second plurality of discrete delay elements being further configured in an arrangement in the form of three parts or sub-sets the arrangement comprising a different predetermined pattern in each of the three parts or sub-sets with the different patterns being electrically connected together, the three sub-sets being arranged so that there are two end sub-sets and an intermediate sub-set, wherein the first and second plurality of discrete delay elements in one of the two end sub-sets extend in a directionally aligned manner with the first and second plurality of discrete delay elements in the other of the two end subsets, wherein the first and second plurality of discrete delay elements in the intermediate sub-set are not directionally aligned with the first and second plurality of discrete delay elements in the two end sub-sets.

3. The solenoid delay line as in claim 2 wherein the intermediate sub-set is comprised of the first and second plurality of discrete delay elements that are positioned in a star-shaped pattern with respect to the two end sub-sets to thereby allow the solenoid delay line to complete a 180 degree turn through the three sub-sets.

4. The solenoid delay line as in claim 2 wherein an interconnection between one end sub-set and the intermediate sub-set is comprised of directly connected first discrete delay elements and an interconnection between the other end sub-set and the intermediate sub-set is comprised of directly connected second discrete delay elements.

5. A solenoid delay line formed on at least two layers of a multilayer printed circuit board (PCB), comprising:
   a first plurality of discrete delay elements disposed on a first layer of said PCB;
   a second plurality of discrete delay elements disposed on a second layer of said PCB, distinct from said first layer,
   each of said first discrete delay elements being electrically connected to at least one of said discrete second delay elements and corresponding ones of said first and second delay elements are connected to each other through vias disposed in said PCB; and
   the first and second plurality of discrete delay elements being further configured in an arrangement in the form of at least two parts or sub-sets, the arrangement comprising a different predetermined pattern in each of the at least two parts or sub-sets with the different patterns being electrically connected together, wherein said first plurality of delay elements are disposed at an angle to said corresponding second plurality of delay elements.

6. The solenoid delay line as in claim 5 wherein said plurality of first and second delay elements are printed on the PCB.

7. The solenoid delay line as in claim 6 wherein with the solenoid delay line has an axis that is disposed in at least one plane of the PCB.

8. A solenoid delay line disposed on at least two layers of a multilayer printed circuit board (PCB), comprising:
   a first plurality of discrete delay elements disposed on a first layer of said PCB; and
   a second plurality of discrete delay elements disposed on a second layer of said PCB, distinct from said first layer,
   each of said first discrete delay elements being electrically connected to at least one of said discrete second delay elements and corresponding ones of said first and second delay elements are connected to each other through vias disposed in said PCB; and
   the first and second plurality of discrete delay elements being further configured in an arrangement in the form of at least two parts or sub-sets, the arrangement comprising a different predetermined pattern in each of the at least two parts or sub-sets with, the different patterns being electrically connected together wherein the predetermined pattern of at least the two parts or sub-sets comprises two spaced apart solenoids, each solenoid being comprised of respective ones of first and second plurality of discrete delay elements interconnected between an outboard set of vias and an inboard set of vias, and with the two spaced apart solenoids being connected together in series at a central joining ground pad.

9. The solenoid delay line, as in claim 8 wherein an area directly adjacent the central joining ground pad located outside of two spaced apart solenoids is devoid of other circuitry.

10. The solenoid delay line as in claim 8 wherein each of the outboard sets of vias are non-aligned, respectively, and each inboard set of vias is arranged in a staggered manner.

11. The solenoid delay line as in claim 9 wherein each of the outboard sets of vias are arranged a non-aligned pattern, respectively, and each of the inboard sets of vias is arranged in a respective row with the respective rows of the inbound set of vias being arranged in an opposing and aligned manner and being separated by a common distance so as to reduce capacitive coupling there across.

12. The solenoid delay line as in claim 11 wherein the inboard and outboard sets of vias are collectively positioned on one side of the central joining ground pad.

13. The solenoid delay line in claim 12 wherein a set of the first discrete delay elements in one of the two solenoids extend generally in a directionally aligned manner with respect to a set of the first discrete delay elements in the other of the two solenoids and a set of the second discrete delay elements in one of the two solenoids extend generally in a directionally aligned manner with respect to a set of the second discrete delay elements in the other of the two solenoids.

* * * * *